United States Patent [19]

Gobrecht et al.

[11] Patent Number: 4,766,481
[45] Date of Patent: Aug. 23, 1988

[54] POWER SEMICONDUCTOR MODULE

[75] Inventors: Jens Gobrecht, Gebenstorf, Switzerland; Reinhold Bayerer, Reichelsheim, Fed. Rep. of Germany

[73] Assignee: Brown, Boveri & Cie AG, Mannheim-Käfertal, Fed. Rep. of Germany

[21] Appl. No.: 925,414

[22] Filed: Oct. 31, 1986

[30] Foreign Application Priority Data

Nov. 2, 1985 [DE] Fed. Rep. of Germany ....... 3538933

[51] Int. Cl.⁴ .............................................. H01L 39/02
[52] U.S. Cl. ......................................... 357/80; 357/74; 357/75; 357/79
[58] Field of Search ...................... 357/80, 79, 74, 75

[56] References Cited

U.S. PATENT DOCUMENTS

| 3,994,430 | 11/1976 | Cusano et al. | 357/79 |
| 4,338,621 | 7/1982 | Braun | 357/80 |
| 4,387,388 | 1/1983 | Zakhariyz | 357/80 |
| 4,488,167 | 12/1984 | Neidig et al. | 357/80 |
| 4,513,355 | 4/1985 | Schroeder et al. | 357/80 |
| 4,639,759 | 1/1987 | Neidig et al. | 357/80 |

Primary Examiner—Martin H. Edlow
Assistant Examiner—Gregory A. Key
Attorney, Agent, or Firm—Herbert L. Lerner; Laurence A. Greenberg

[57] ABSTRACT

A power semiconductor module includes a multi-layered substrate formed of a first ceramic bottom plate, at least one second ceramic plate disposed above and parallel to the first ceramic bottom plate, a metal foil in the form of a textured metallization located between and directly bonded to the ceramic plates, the second ceramic plate having cutouts formed therein, and assembly elements soldered in the cutouts.

10 Claims, 2 Drawing Sheets

POWER SEMICONDUCTOR MODULE

The invention relates to a power semiconductor module, including a first ceramic bottom plate metallized on at least one side thereof, and at least one second ceramic plate disposed above and parallel to the first ceramic bottom plate. Electrically insulated modules of this kind have a bottom plate in the form of a ceramic plate, which is metallized on one or both sides thereof.

Current converter circuits or parts thereof can be constructed with power semiconductor modules. To this end, the required elements such as semiconductor chips, passive components and bonding elements are soldered onto the bottom plate. During the soldering operation, the elements to be soldered must be fixed at the appropriate locations. In order to accomplish this, soldering forms are usually used, which are prepared especially for a given module or are adapted to a module. The expense of preparing the soldering form itself, as well as the expense in terms of material and labor time for producing the module with the aid of the soldering form, depends on the way in which the module is formed.

German Published, Non-Prosecuted Application DE-OS No. 34 06 528, corresponding to U.S. patent application Ser. No. 705,089, filed Feb. 25, 1985, contains a suggestion for simplifying the soldering form, in which a sandwich-like structure of a module is proposed. The semiconductor elements are disposed between a ceramic bottom plate and a ceramic cover plate. In order to fix the components in place, centering pins and centering tubes that are inserted into the cover plate are required. Electric connections between the bottom plate and the cover plate are produced by means of bonding dies. Overall, a relatively great amount of individual parts are required for producing the module.

A further problem in power semiconductor modules is that a high circuit speed, which is made possible by the semiconductor component, is reduced because of high leakage inductance of the lines in the interior of module.

It is accordingly an object of the invention to provide a power semiconductor module which overcomes the hereinafore-mentioned disadvantages of the heretofore-known devices of this general type.

With the foregoing and other objects in view there is provided, in accordance with the invention, a power semiconductor module, comprising a multi-layered substrate formed of a first ceramic bottom plate, at least one and optionally other second ceramic plate disposed above and parallel to the first ceramic bottom plate, one or more metal foils in the form of one or more textured metallizations located between and directly bonded to the ceramic plates, the second ceramic plate or plates having cutouts formed therein, and assembly or component elements soldered in the cutouts.

In accordance with another feature of the invention, the first ceramic bottom plate has a lower surface facing a heat sink, and including another metallization disposed on the lower surface.

In accordance with a further feature of the invention, the textured metallization or metallizations and the second ceramic plate or plates form striplines having a defined wave resistance.

In accordance with an added feature of the invention, the striplines have a given width and spacing, and including connection elements connected to the metallization or metallizations having the given width and spacing of the striplines for extending the defined wave resistance of the internal striplines to external connections.

In accordance with an additional feature of the invention, there is provided at least one trigger circuit for an inserted controllable power semiconductor in the module.

In accordance with yet another feature of the invention, there is provided a hood-like or frame-like plastic housing in which the substrate is disposed.

In accordance with a concomitant feature of the invention, there is provided a further metallization disposed above the second ceramic plate, the second ceramic plate and the further metallization having recesses and bores formed therein permitting a soft casting compound introduced therein to creep into given locations in the module.

The structure of the power semiconductor module according to the invention has a number of advantages as follows:

The multi-layered construction of the substrate forming the bottom of the module is prepared by direct bonding of thick copper foils to ceramic plates. The thickness of the copper foils is from 0.1 to 0.5 mm. This kind of substrate has great mechanical strength. Thus, the required evenness of the basic surface can be attained with high accuracy, and high flexural and breaking strength is attained.

The substrate described above is highly temperature resistant to approximately 1000° C. It is therefore possible for semiconductor elements to be soldered at high temperatures, such as at 400° C. in a hydrogen atmosphere. Thus, the adhesive strength of the metallization on the ceramic remains unchanged.

The thick copper conductor tracks also assure good transverse dissipation of the heat loss of power semiconductors. Such components can therefore also be assembled in relatively high insulated planes, such as a second or third plane, while maintaining low heat resistance.

The structure of the substrate according to the invention enables a strip-like conduction of current to take place in the substrate, which keeps the leakage inductance low.

The substrate is electrically insulated from a bottom metallization or from a heat sink by means of the first ceramic layer. The insulation voltage may typically be 2.5 kVeff. This insulation voltage is also attainable between separated conductor tracks on one layer or between conductor tracks that are located on different layers. The creepage paths and air gaps between the cooling surface and the connections which are extended upward are maintained, even if the external connections in the substrate have a ribbon conductor structure.

The ceramic expansion of the substrate is adapted to silicon and lends great load alternation endurance to the soldered connections.

Other features which are considered as characteristic for the invention are set forth in the appended claims.

Although the invention is illustrated and described herein as embodied in a power semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 3:
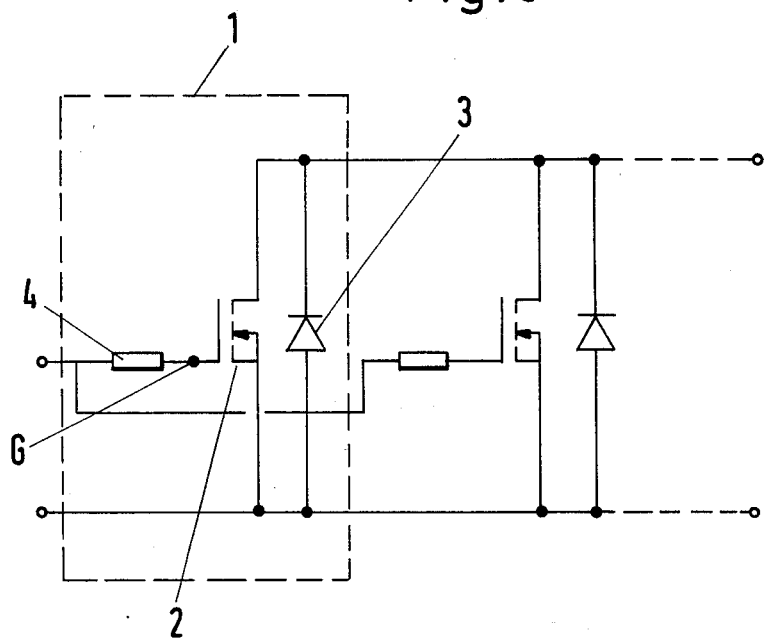
FIG. 3 is a schematic electric circuit diagram of the power semiconductor module.

Referring now to the figures of the drawings in detail and first, particularly, to FIG. 3 thereof, there is seen a semiconductor circuit in which a circuit portion 1 framed by a broken line is emphasized. The circuit portion 1 includes a power transistor 2 with a diode 3 connected parallel thereto and a resistor 4 connected upstream of the gate G of the power transistor 2. The power transistor 2 is a (vertical) power MOSFET (metal oxide semiconductor field effect transistor), and the diode 3 is a Schottky recovery diode. A plurality of such circuit portions 1 may be provided in one power semiconductor module and may be connected in parallel, for instance.

Figure 1:
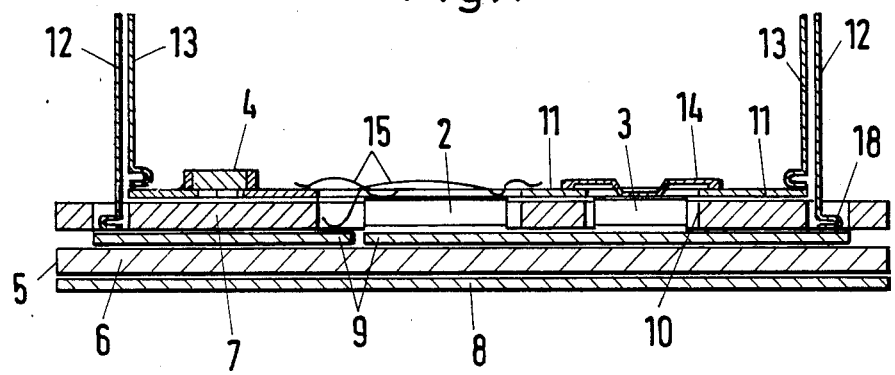
FIG. 1 is a diagrammatic, cross-sectional view of a power semiconductor module.
Figure 2:
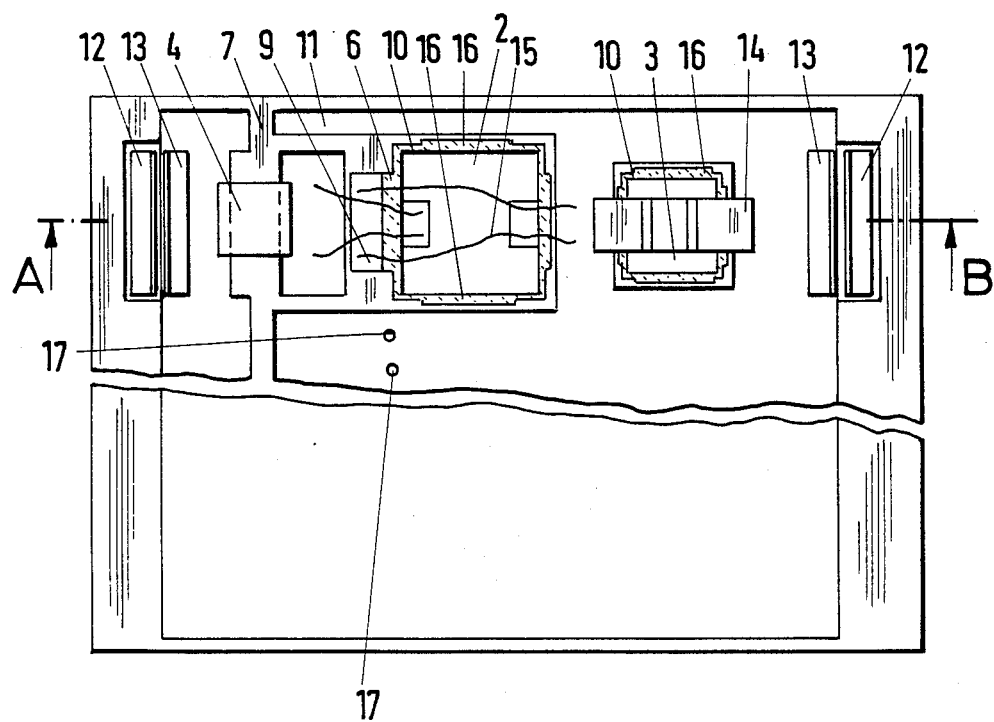
FIG. 2 is a top-plan view of the power semiconductor module.

FIG. 1 shows a cross section through a sectional plane A-B shown in FIG. 2; the section being taken through the circuit portion 1 emphasized in FIG. 3.

In FIG. 1, a substrate 5 is shown which includes two ceramic plates 6, 7. The first plate is a ceramic bottom plate 6 which has a metallization 8 over its entire lower surface facing a non-illustrated heat sink and a textured metallization 9 on its upper surface. The second plate is a ceramic plate 7 disposed on the textured metallization 9. The second ceramic plate 7 is provided with cutouts 10 for receiving semiconductor components 2, 3 and another textured metallization 11 on the upper surface thereof. All of the metallizations 8, 9. 11 are formed of a copper foil which is typically from 0.1 to 0.5 mm thick. The layers of the substrate 5, namely the metallization 8 over the entire surface, the bottom plate 6, the textured metallization 9, the second ceramic plate 7 and the other textured metallization 11, as well as other optional ceramic and metal layers, are connected to one another in a single operation by direct bonding. A bonding method of this kind is described, for instance, in German Published, Non-Prosecuted Application DE-OS No. 30 36 128, corresponding to U.S. Pat. No. 4,505,418.

The semiconductor components 2, 3 with solder previously applied and connection elements 12, which are bonded to the textured metallization 9, are inserted into the cutouts 10 in the second ceramic plate 7. Connection elements 13, which are to be bonded to the other textured metallization 11 as well as a resistor 4 and a clip 14 can be affixed to a third non-illustrated ceramic plate which is provided with corresponding cutouts and is applied to the other metallization 11 of the second ceramic plate 7, or they can be affixed by other means. All of the soldered connections are produced simultaneously in one operation. Other internal connections are then produced by the bonding of aluminum wires 15.

The bottom plate 6 serves to insulate against the heat sink and assures that there is low thermal resistance to the conduction of heat away from the semiconductor components 2, 3 to the heat sink. The second ceramic plate 7 and any other ceramic plates optionally disposed above it are to be considered as so-called "lost" solder forms, because they are a component of the module. In any case, however they are not to be considered as merely lost solder forms, because the multi-layered structure of the substrate 5 also provides great mechanical strength of the module and makes it easier to attain a smooth bottom plate 6 when producing the module. Furthermore, if the substrate 5 has a multi-layered structure, so-called ribbon conductors or striplines for load or trigger lines are produced, by providing current input and output lines in strips located one above the other. In this way very low inductance is attained and by suitably dimensioning the strip width and the thickness of the second ceramic plate 7, a defined wave resistance in the supply lines is attained. The geometry of the lines that is thereby defined is suitably maintained when the external connections are made; that is, the connection elements 12, 13 have the same width and the same effective mutual spacing as the textured metallizations 9, 11 with the second ceramic plate 7 located therebetween.

If the lines are provided in this way in the module, it becomes substantially easier for a user to exploit the circuit speed of MOSFETs, for example. By placing the resistor 4 in the form of a chip resistor in the trigger line, it is possible to match terminal impedance for the supply line. At the same time, parasitic oscillations between what may be a great number of parallel MOSFET gates in the module, are damped.

The proposed layering of a plurality of textured ceramic and metal layers over the bottom plate also enables hybrid integration of trigger circuits in a power semiconductor module. Trigger circuits constructed in chip form are inserted into cutouts in a ceramic layer and are soldered and/or bonded in the same manner as the power semiconductor chips 2, 3.

FIG. 2 is a plan view of a circuit portion 1 provided in the module. In addition to the components already described above, the following additional details are shown. Recesses 16 are provided inside the cutouts 10 in the second ceramic plate 7 and bores 17 are formed through the second ceramic plate 7 and any other layers located above it. The bores 17 as well as slits created by means of the recesses 16, make it possible for a soft casting compound, which is to be introduced later for providing electric insulation, to creep between the textured metallizations 9, 11.

The production of the cutouts 10 with the recesses 16 and the bores 17 is performed with so-called "green" ceramic plates, that is, those which have not yet been sintered.

The structure of the copper layers is created either by suitably stamping the copper foils prior to bonding to the ceramic, or by etching the copper after bonding to the ceramic, if the copper layers are still accessible.

After the soldered and bonded connections have been made, the finished, assembled substrate 5 can be inserted into a hood-shaped or frame-shaped plastic housing in a conventional manner, the substrate 5 then forming the bottom of the module. The metallization 8 which is disposed over the entire lower surface of the module is considered an advantageous feature, although it is not absolutely necessary. It assures good thermal contact and may, for instance, compensate for slight surface roughness of the heat sink so that the module can be mounted in place without soft casting compound. The module is filled up to a desired level through an upper opening in a plastic housing. The connection elements 12, 13 are extended through suitable openings in the plastic housing, which assures the intended mutual spacing. Expansion bends provided in the connection elements 12, 13 relieve the substrate 5 of mechanical strains that may originate in external connections.

The foregoing is a description corresponding in substance to German Application No. P 35 38 933.8, dated Nov. 2, 1985, the International priority of which is being claimed for the instant application, and which is hereby made part of this application. Any material discrepancies between the foregoing specification and the aforementioned corresponding German application are to be resolved in favor of the latter.

We claim:

1. Power semiconductor module, comprising a multi-layered substrate formed of a first ceramic bottom plate, at least one second ceramic plate disposed above and parallel to said first ceramic bottom plate, a metal foil in the form of a textured metallization having a thickness of substantially between 0.1 and 0.5 mm located between and directly bonded to said ceramic plates, said second ceramic plate having cutouts formed therein defining a soldering form, and assembly elements fixed in place by said soldering form and soldered in said cutouts.

2. Power semiconductor module according to claim 1, including at least one other ceramic plate disposed on said second ceramic plate and at least one other textured metallization disposed between and directly bonded to said second ceramic plate and said at least one other ceramic plate, said at least one other ceramic plate having cutouts formed therein for said assembly elements.

3. Power semiconductor module according to claim 1, including other ceramic plates disposed above said second ceramic plate and other textured metallizations disposed between said second ceramic plate and one of said other ceramic plates and between said other ceramic plates, said other ceramic plates having cutouts formed therein for said assembly elements.

4. Power semiconductor module according to claim 1, wherein said first ceramic bottom plate has a lower surface, and including another metallization disposed on said lower surface.

5. Power semiconductor module, comprising a multi-layered substrate formed of a first ceramic bottom plate, at least one second ceramic plate disposed above and parallel to said first ceramic bottom plate, a metal foil in the form of a textured metallization having a thickness of substantially between 0.1 and 0.5 mm located between and directly bonded to said ceramic plates, said second ceramic plate having cutouts formed therein defining a soldering form, and assembly elements fixed in place by said soldering form and soldered in said cutouts, said textured metallization and said second ceramic plate forming striplines having a defined wave resistance.

6. Power semiconductor module according to claim 5, wherein said striplines have a given width and spacing, and including connection elements connected to said metallization having said given width and spacing of said striplines for extending said defined wave resistance of said internal striplines to external connections.

7. Power semiconductor module, comprising a multi-layered substrate formed of a first ceramic bottom plate having a lower surface, at least one second ceramic plate disposed above and parallel to said first ceramic bottom plate, a metal foil in the form of a textured metallization having a thickness of substantially between 0.1 and 0.5 mm located between and directly bonded to said ceramic plates, another metallization disposed on said lower surface of said first ceramic plate, said second ceramic plate having cutouts formed therein defining a soldering form, and assembly elements fixed in place by said soldering form and soldered in said cutouts, said metallizations and said second ceramic plate forming striplines having a defined wave resistance.

8. Power semiconductor module according to claim 7, wherein said striplines have a given width and spacing, and including connection elements connected to said metallizations having said given width and spacing of said striplines for extending said defined wave resistance of said internal striplines to external connections.

9. Power semiconductor module according to claim 1, including a resistor connected to one of said assembly elements.

10. Power semiconductor module, comprising a multi-layered substrate formed of a first ceramic bottom plate, at least one second ceramic plate disposed above and parallel to said first ceramic bottom plate, a metal foil in the form of a textured metallization having a thickness of substantially between 0.1 and 0.5 mm located between and directly bonded to said ceramic plates, said second ceramic plate having cutouts formed therein defining a soldering form, assembly elements fixed in place by said soldering form and soldered in said cutouts, and a further metallization disposed on said second ceramic plate, said second ceramic plate and said metallizations having recesses and bores formed therein permitting a soft casting compound introduced therein to creep into given locations in the module.

* * * * *